United States Patent
Niimi et al.

(10) Patent No.: US 8,816,446 B2
(45) Date of Patent: *Aug. 26, 2014

(54) FORMATION OF METAL GATE ELECTRODE USING RARE EARTH ALLOY INCORPORATED INTO MID GAP METAL

(75) Inventors: Hiroaki Niimi, Dallas, TX (US); Manuel Angel Quevedo-Lopez, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/241,751

(22) Filed: Sep. 23, 2011

(65) Prior Publication Data

US 2012/0012941 A1    Jan. 19, 2012

Related U.S. Application Data

(63) Continuation of application No. 12/206,324, filed on Sep. 8, 2008, now Pat. No. 8,058,122.

(60) Provisional application No. 61/017,397, filed on Dec. 28, 2007.

(51) Int. Cl.
| | |
|---|---|
| H01L 21/8238 | (2006.01) |
| H01L 21/02 | (2006.01) |
| H01L 29/78 | (2006.01) |
| H01L 29/49 | (2006.01) |
| H01L 29/51 | (2006.01) |

(52) U.S. Cl.
CPC ....... *H01L 21/823842* (2013.01); *H01L 39/665* (2013.01); *H01L 29/4966* (2013.01); *H01L 21/823857* (2013.01); *H01L 29/517* (2013.01)
USPC ........... 257/411; 257/412; 438/216; 438/287; 438/587

(58) Field of Classification Search
USPC ......... 438/216, 287, 587, 195, 283, 275, 279, 438/588, 591, 207, 177; 257/410, 411, 625, 257/E21.686, E21.625, E21.639
See application file for complete search history.

(56) References Cited

U.S. PATENT DOCUMENTS

| | | | |
|---|---|---|---|
| 6,936,508 B2 | 8/2005 | Visokay et al. | |
| 7,425,497 B2 * | 9/2008 | Chudzik et al. | 438/591 |
| 7,820,552 B2 * | 10/2010 | Kanakasabapathy et al. | 438/704 |
| 2006/0234433 A1 | 10/2006 | Luan et al. | |
| 2007/0148838 A1 * | 6/2007 | Doris et al. | 438/197 |

* cited by examiner

*Primary Examiner* — Colleen Matthews
*Assistant Examiner* — Quovaunda V Jefferson
(74) *Attorney, Agent, or Firm* — Jacqueline J. Garner; Frederick J. Telecky, Jr.

(57) ABSTRACT

Semiconductor devices and fabrication methods are provided, in which metal transistor gates are provided for MOS transistors. A rare earth-rare earth alloy incorporated metal nitride layer is formed above a gate dielectric. This process provides adjustment of the gate electrode work function, thereby tuning the threshold voltage of the resulting NMOS transistors.

17 Claims, 8 Drawing Sheets

FORMATION OF METAL GATE ELECTRODE USING RARE EARTH ALLOY INCORPORATED INTO MID GAP METAL

RELATED APPLICATIONS

This application is a continuation of U.S. Non Provisional Application Ser. No. 12/206,324, filed Sep. 8, 2008, which claims the priority of U.S. Provisional Application Ser. No. 61/017,397, filed Dec. 28, 2007, the contents of which are herein incorporated by reference in its entirety.

FIELD OF INVENTION

The present invention relates generally to semiconductor devices and more particularly to metal gate MOS transistor devices and fabrication methods for making the same.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

In operation of the resulting MOS transistor, the threshold voltage (Vt) is the gate voltage value required to render the channel conductive by formation of an inversion layer at the surface of the semiconductor channel. Complimentary MOS (CMOS) devices have become widely used in the semiconductor industry, wherein both n-channel and p-channel (NMOS and PMOS) transistors are used to fabricate logic and other circuitry. For enhancement-mode (e.g., normally off) devices the threshold voltage Vt is positive for NMOS and negative for PMOS transistors. The threshold voltage is dependent upon the flat-band voltage, where the flat-band voltage depends on the work function difference between the gate and the substrate materials, as well as on surface charge.

The work function of a material is a measure of the energy required to move an electron in the material outside of a material atom from the Fermi level, and is usually expressed in electron volts (eV). For CMOS products, it is desirable to provide predictable, repeatable, and stable threshold voltages (Vt) for the NMOS and PMOS transistors. To establish Vt values, the work functions of the PMOS and NMOS gate contact and the corresponding channel materials are independently tuned or adjusted through gate and channel engineering, respectively.

Gate stack engineering is employed to adjust the work function of the gate contact materials, where different gate work function values are set for PMOS and NMOS gates. The need to independently adjust PMOS and NMOS gate work functions has made poly-silicon attractive for use as a gate contact material in CMOS processes, since the work function of poly-silicon can be easily raised or lowered by doping the poly-silicon with p-type or n-type impurities, respectively. The PMOS poly-silicon gates are typically incorporated with p-type impurities and NMOS gate poly-silicon is incorporated with n-type dopants, typically during implantation of the respective source/drain regions following gate patterning. In this way, the final gate work functions are typically near the Si conduction band edge for NMOS and near the valence band edge for PMOS. The provision of dopants into the poly-silicon also has the benefit of increasing the conductivity of the gate electrode. Poly-silicon has thus far been widely used in the fabrication of CMOS devices, wherein the gate engineering provides a desired gate electrode conductivity (e.g., sheet resistance value) by conventional tuning (e.g., implants), and the threshold voltage fine tuning is achieved by tailoring the channel doping level through the Vt adjust implants.

FIG. 1 illustrates a conventional CMOS fabrication process 10 beginning at 12, in which front end processing is performed at 14, including well formation and isolation processing. At 16 and 18, channel engineering is performed (e.g., Vt adjust, punch-thru, and channel stop implants) for PMOS and NMOS regions, respectively. A thin gate dielectric and an overlying poly-silicon layer are formed at 20 and 22, respectively, and the poly-silicon is patterned at 24 to form gate structures for the prospective NMOS and PMOS transistors. The gate structures are then encapsulated at 26, typically through oxidation, and highly-doped drain (HDD) implants are performed at 28 to provide p-type dopants to prospective source/drains of the PMOS regions and n-type dopants to source/drains of the NMOS regions, using the patterned gate structures and isolation structures as an implantation mask. Sidewall spacers are then formed at 30 along the lateral sidewalls of the gate structures.

At 32, the PMOS source/drain regions and the PMOS poly-silicon gate structures are implanted with p-type dopants to further define the PMOS source/drains, and to render the PMOS gates conductive. Similarly, the NMOS source/drain regions and the NMOS poly-silicon gate structures are implanted at 34 with n-type dopants, further defining the NMOS source/drains and rendering the NMOS gates conductive. Thereafter, the source/drains and gates are silicided at 36 and back end processing (e.g., interconnect metalization, etc.) is performed at 38, before the process 10 ends at 40. In the conventional process 10, the channel engineering implants at 16 and 18 shift the Vt of the PMOS and NMOS channel regions, respectively, to compensate for the changes in the PMOS and NMOS poly-silicon gate work functions resulting from the source/drain implants at 32 and 34, respectively. In this manner, the desired work function difference between the gates and channels may be achieved for the resulting PMOS and NMOS transistors, and hence the desired threshold voltages.

The gate dielectric or gate oxide between the channel and the gate electrode is an insulator material, typically $SiO_2$ or other dielectric, that operates to prevent current from flowing from the gate electrode into the channel when a voltage is applied to the gate electrode. The gate dielectric also allows an applied gate voltage to establish an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate dielectric that is formed over the semiconductor surface.

However, there are electrical and physical limitations on the extent to which $SiO_2$ gate dielectrics can be made thinner. These include gate leakage currents tunneling through the thin gate oxide, limitations on the ability to form very thin oxide films with uniform thickness, and the inability of very thin $SiO_2$ gate dielectric layers to prevent dopant diffusion from the gate poly-silicon into the underlying channel. Accordingly, recent scaling efforts have focused on high dielectric constant (high-k) materials having dielectric constants greater than that of $SiO_2$, which can be formed in a thicker layer than scaled $SiO_2$, and yet which produce equivalent field effect performance. A physically thicker high-k dielectric layer can thus be formed to avoid or mitigate tunneling leakage currents, while still achieving the required electrical performance equivalent (e.g., capacitance value) to a thinner $SiO_2$.

Thus, while poly-silicon gate electrodes have previously offered flexibility in providing dual work functions at the band edges for CMOS processes, the future viability of conventional poly-silicon gate technology is lessened as scaling efforts continue. Accordingly, attention has recently been directed again to the possibility of using metal gate electrodes in CMOS products.

It has also been proposed to utilize high-k dielectric materials in combination with a rare earth metal and mid-gap metal nitride to lower the work function of NMOS metal gates. The rare earth metal is provided in a relatively high concentration, up to around 8 atomic percent, in the mid-gap nitride metal.

These proposals, however, result in degradation of electron mobility due to the rare earth metal diffusion into the gate dielectric/silicon substrate interface. There remains a need for dual or differentiated work function capability (e.g., for PMOS and NMOS transistors) in CMOS processes. In this regard, metal work functions are not shifted as easily by the same amounts as was the case for poly-silicon. Accordingly, there is a need for improved CMOS transistor metal gate designs and fabrication techniques by which the benefits of scaling can be achieved while reducing or eliminating the degradation of electron mobility.

SUMMARY OF THE INVENTION

In one embodiment, the invention is directed to a method of fabricating an NMOS metal gate structure in a semiconductor device, the method comprising forming a high-k gate dielectric above a semiconductor body; forming a rare earth-rare earth metal alloy mid gap metal gate electrode layer above the gate dielectric; and patterning the metal gate electrode layer to form an NMOS gate structure In another embodiment, the invention is directed to a method of fabricating an NMOS metal gate structure in a semiconductor device, the method comprising forming a high-k gate dielectric above a semiconductor body; forming a first layer of a rare earth metal alloy incorporated mid gap metal gate electrode layer above the gate dielectric; forming a second layer of a rare earth metal alloy incorporated mid gap metal gate electrode layer above the first layer; and patterning the metal gate electrode to form an NMOS gate structure.

In a further embodiment, the invention is directed to a method of fabricating an NMOS metal gate structures in a semiconductor device, the method comprising forming a high-k gate dielectric on PMOS and NMOS regions above a semiconductor body; applying a first mask in the PMOS region; forming a rare earth-rare earth metal alloy incorporated mid gap metal nitride layer above the gate dielectric in the NMOS region; removing the mask and applying a second mask over the NMOS region and depositing a metal nitride in the PMOS region; removing the mask; and patterning the metal nitride layers to form an NMOS gate structure in the NMOS region and a PMOS gate structure in the PMOS region.

In a still further embodiment, the invention is directed to a semiconductor device comprising an NMOS transistor gate structure comprising a mid-gap metal nitride layer and a high-k gate dielectric between the metal nitride layer and a semiconductor body, the metal nitride layer having a rare earth-rare earth metal alloy incorporated therein; a PMOS transistor gate structure.

DETAILED DESCRIPTION OF THE INVENTION

Figure 1:
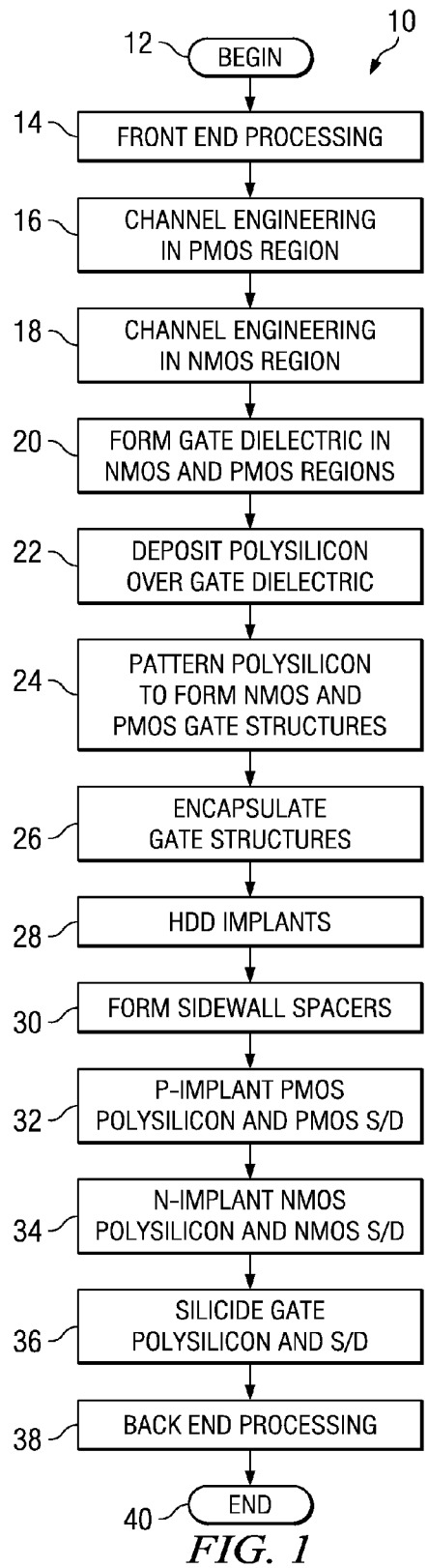
FIG. 1 is a simplified flow diagram illustrating a conventional poly-silicon gate CMOS fabrication process including channel engineering for NMOS transistors.

One or more implementations of the invention will now be described with reference to the attached drawings, wherein like reference numerals are used to refer to like elements throughout, and wherein the illustrated structures are not necessarily drawn to scale. The invention relates to metal gate CMOS devices and fabrication methods. The invention may be employed to simplify channel engineering steps in particular, and fabrication processing generally, while mitigating or eliminating the capacitance depletion shortcomings of conventional CMOS devices.

In the methods and devices of the invention, a rare earth-rare earth metal alloy (hereinafter, "RE-RE metal alloy") incorporated mid-gap metal nitride gate is formed above a gate dielectric in the NMOS regions, wherein these and the gate dielectric may be formed by separate processes for the NMOS and PMOS regions. As used herein, metal nitrides are any materials comprising metal and nitrogen content, including but not limited to metal nitrides, metal silicon nitrides, metal aluminum nitrides, and metal aluminum silicon nitrides. The RE-RE metal alloy material can include rare earth metals comprising one or more of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu). In one embodiment, the RE-RE metal combination can be formed from two RE metals whose atomic number (Z) differs by an amount not greater than four to make a RE-RE alloy. Thus, for example, a RE-RE metal alloy may comprise a Dy (Z=66)-Er (Z=68) alloy, a Dy (Z=66)-Gd (Z=64) alloy, an Er (Z=68)-Gd (Z=64) alloy, a Dy (Z=66)-Yb (Z=70) alloy, or an Er(Z=68)-Yb (Z=70) alloy, among others.

In the examples illustrated and described herein, moreover, a single metal nitride starting material may be concurrently formed above the gate dielectric in both the NMOS region and the PMOS region, for example, using a single deposition process. The gate dielectric is then changed in the NMOS region such that the mid-gap metal electrode layer is modified by doping with a RE-RE metal alloy in the NMOS region. After formed the NMOS with the RE-RE incorporated mid gap nitride metal, fabricate PMOS with p-metal separately. The implanted gate electrode may then have the desired work function or be close to the desired work function, thus allowing elimination or significant simplification of channel engineering for one or both transistor types.

Figure 2:
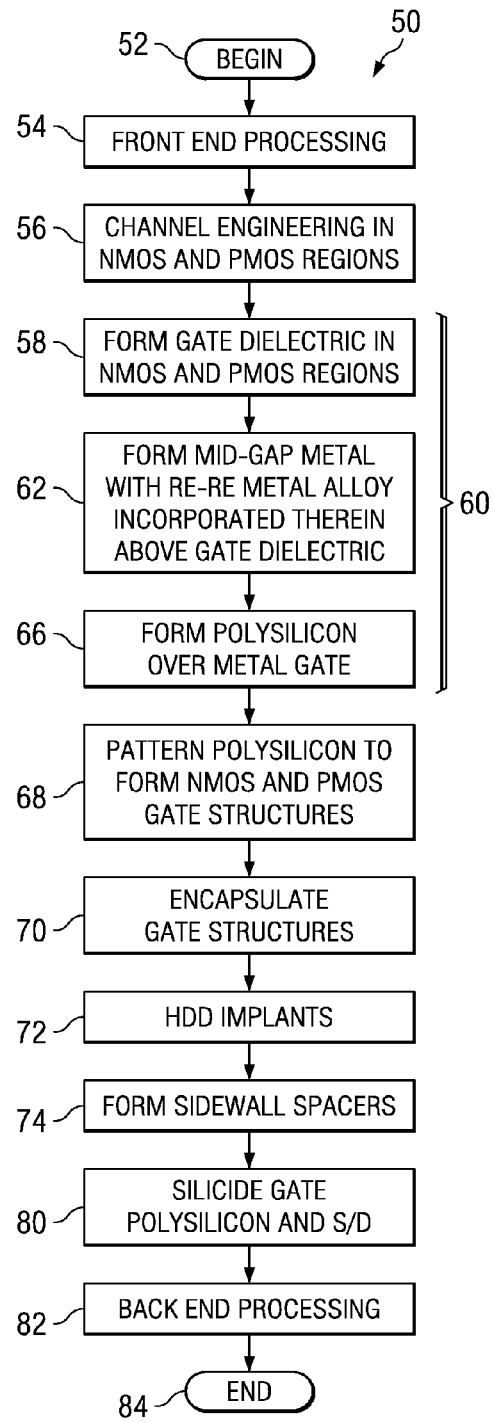
FIG. 2 is a flow diagram illustrating an exemplary method of fabricating a metal gate electrode having a rare earth-rare earth metal alloy metal gate in accordance with an aspect of the invention.
Figure 3A:
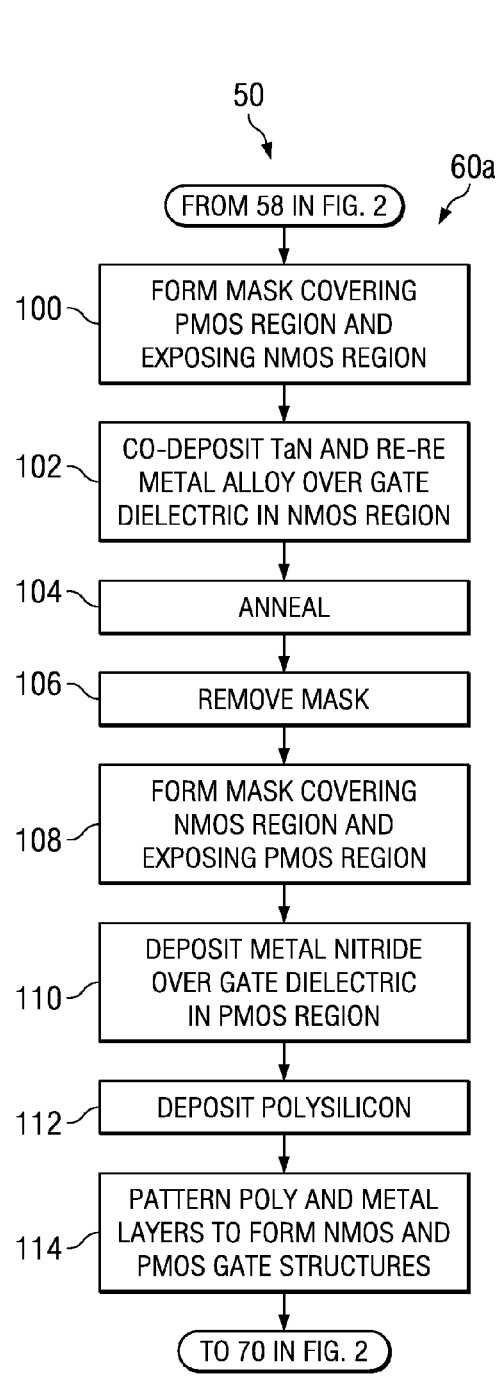
FIGS. 3A-3B are partial flow diagrams illustrating various techniques for forming tuned NMOS metal gate structures in the fabrication method of FIG. 2.
Figure 3B:
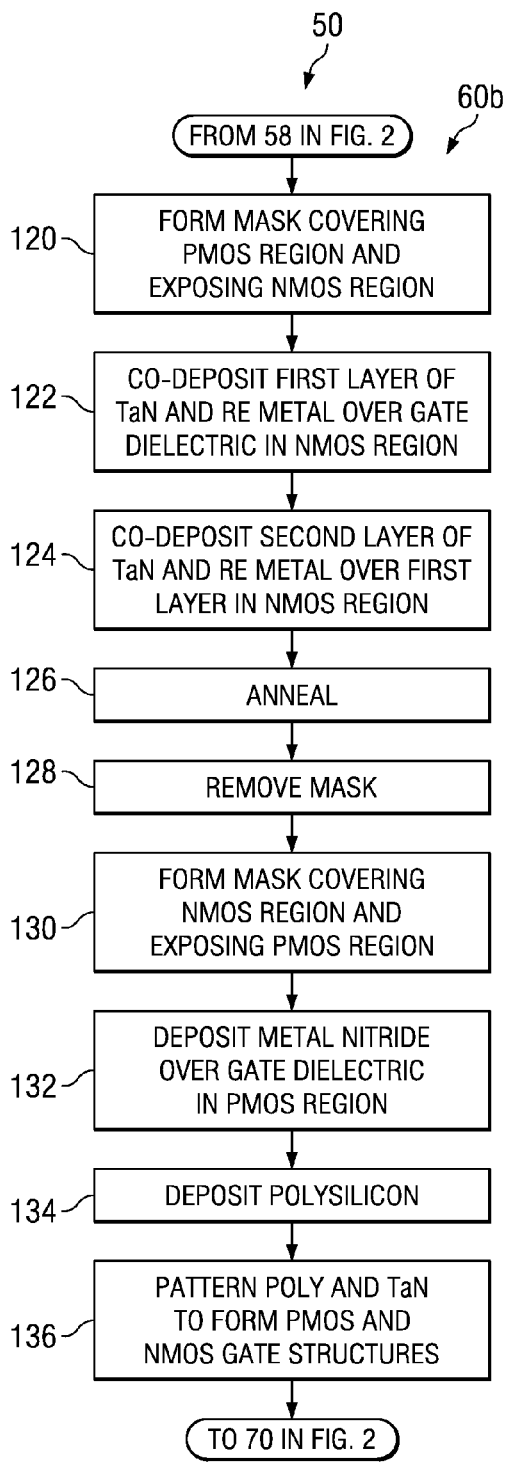

Referring initially to FIGS. 2-3B, an exemplary method 50 is illustrated in FIG. 2 for fabricating metal gate structures for PMOS and NMOS transistors in accordance with the invention. FIGS. 3A-3B illustrate various exemplary implementations of portions of the method 50 relating to creation of gate structures with differentiated work functions using a single starting material. While the exemplary method 50 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

The method 50 begins at 52 in FIG. 2, wherein front end processing is performed at 54. Any front end processing may be performed within the scope of the invention, wherein the processing at 54 may include, for example, formation of n and p wells using diffusion, implantation, or other suitable processing steps, as well as formation of isolation structures in field regions of a device wafer using LOCOS, STI, or any suitable isolation processing. While the figures provided show use of LOCOS type field-oxide (FOX), type isolation structures, shallow trench isolation (STI) or other type isolation structures may also be employed and are contemplated by the present invention. The methods and devices of the invention may be implemented using any type of semiconductor body, including but not limited to bulk semiconductor wafers (e.g., silicon), epitaxial layers formed over a bulk semiconductor, SOI wafers, etc. At 56 channel engineering may be performed in both the NMOS and PMOS regions, for example, threshold voltage adjustment implants, punch-through implants, etc.

At 58, a gate dielectric is formed in the NMOS and PMOS regions using any suitable materials, material thicknesses, and processing steps, including a single thermal oxidation or deposition or combinations thereof to form a gate dielectric above the semiconductor body, which may be a single layer or multiple layers. The invention may be employed in conjunction with gate dielectric materials formed from high-k dielectrics, including but not limited to binary metal oxides including aluminum oxide ($Al_2O_3$), zirconium oxide ($ZrO_2$), hafnium oxide ($HfO_2$), lanthanide oxides (e.g., $La_2O_3$, $Yb_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanide oxynitrides (e.g., LaON, YbON), yttrium oxynitride (YON), as well as their silicates and aluminates such as ZrSiON, HfSiON, LaSiON, YSiON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and bi-layered perovskite system material such as strontium bismuth tantalate, bismuth titanate and others. Separate processing may optionally be employed to form different gate dielectrics in the NMOS and PMOS regions within the scope of the invention. In the examples illustrated and described herein, a thermal oxidation is performed at 58 to create a thin gate dielectric oxide overlying the substrate.

Following gate dielectric formation at 58, the method 50 provides for gate fabrication indicated generally at 60, wherein FIG. 2 illustrates the general metal gate fabrication principles of the method 50, and FIGS. 3A-3B illustrate a few of the embodiments of the gate fabrication 60, as described further below. At 62 in FIG. 2, a RE-RE metal alloy incorporated mid-gap metal nitride is formed over the gate dielectric in the NMOS region to a thickness of, in one embodiment, from about 5 Å to about 10 Å, and in one embodiment a thickness of about 20 Å. Suitable deposition processes include, for example, physical vapor deposition (PVD), chemical vapor deposition (CVD), or atomic layer deposition (ALD).

The RE-RE metal alloy may be present in the mid-gap metal nitride in a concentration of from about 10 atomic % (at. %) to about 20 at. %. The mid gap metal nitride is present in an amount from about 80 at. % to about 90 at. %. Further, the ratio of RE-RE metal alloy to mid-gap metal nitride may be, in one embodiment, from about 1 at. % to about 9 at. %, and in one embodiment from about 2 at. % to about 5 at. %. In one embodiment the ratio of RE metal to RE metal in the alloy will be from about 25. % to about 75 at. %.

Any metal nitride may be used within the scope of the invention, including but not limited to metals containing nitrogen or metal alloys containing nitrogen, of any stoichiometry or relative concentrations of metal/metal alloy and nitrogen. The materials may be formed using any metals, ternary metals, or metal alloys within the scope of the invention, for example, those that include Ti, Ta, Hf, Zr, W, Mo, or others. Thus, although illustrated and described in the examples below primarily in the context of TaN, metal nitrides including but not limited to metal nitrides $M_xN_y$, metal silicon nitrides, $M_xSi_yN_z$, metal aluminum nitrides $M_xAl_yN_z$, and metal aluminum silicon nitrides $M_wAl_xSi_yN_z$ (where M is a metal such as Ti, Ta, Hf, Cr, Mo, Zr, W, etc.), or equivalents may be used within the scope of the invention.

Different processing steps may be used at 62 or some processing operations thereof may be concurrently performed in both the NMOS and PMOS regions within the scope of the invention. As described below with respect to FIG. 3A, the mid-gap metal gate is then modified with a RE-RE metal alloy in NMOS regions through co-deposition, after masking of the PMOS region. Any suitable deposition techniques and operational settings may be employed, as set forth hereinabove. Reaction of the RE-RE metal alloy with the mid-gap metal nitride provides adjustment of the material work function, thereby tuning the threshold voltage of the resulting NMOS transistors without significant channel engineering, and without the complications associated with electron mobility degradation.

Figure 4A:
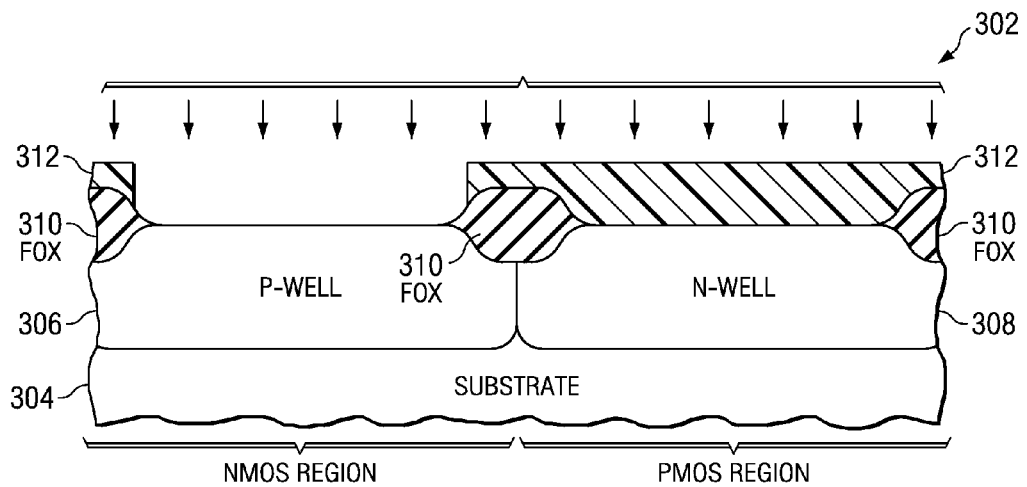
FIGS. 4A-4I are partial side elevation views in section illustrating exemplary NMOS transistors undergoing CMOS metal gate processing in accordance with the invention at various stages of fabrication.
Figure 4B:
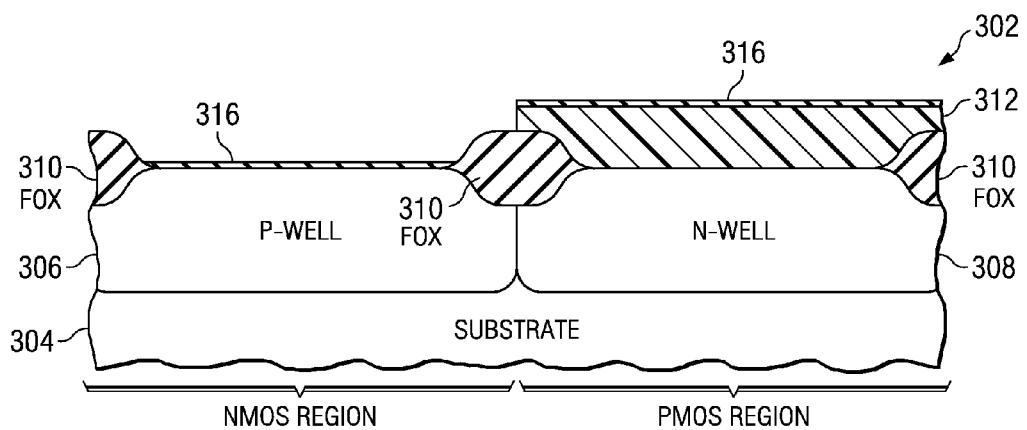
Figure 4C:
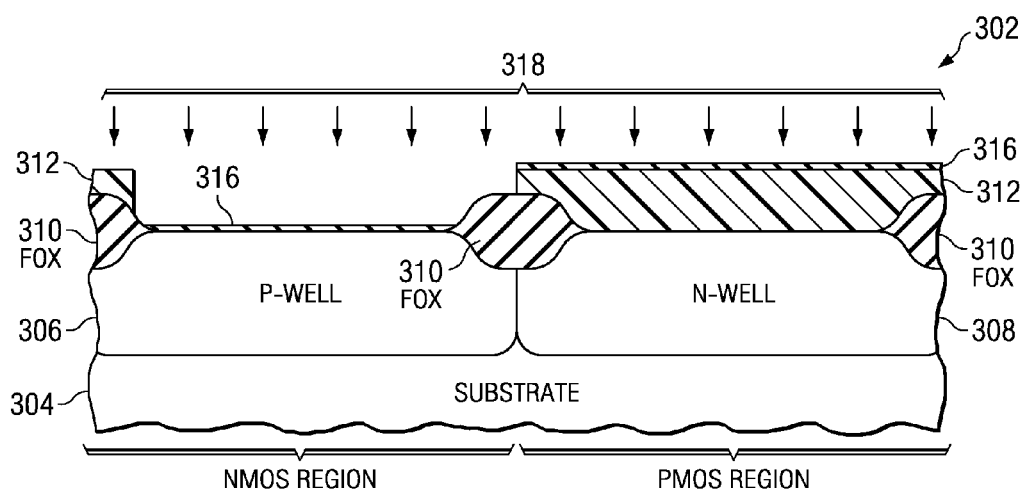

Referring now to FIGS. 2, 3A and 4A-4I, an exemplary CMOS device 302 is illustrated in FIGS. 4A-4I at various stages of fabrication processing generally according to the method 50. In this example, the gate fabrication for the NMOS and PMOS transistors (e.g., 60 in method 50 of FIG. 2) is illustrated in further detail in FIG. 4A, where the CMOS device 302 includes a silicon substrate semiconductor body 304 with a p-well 306 formed in an NMOS region and an n-well 308 formed in a PMOS region. The device 302 further comprises shallow trench isolation (STI) or field oxide (FOX) isolation structures 310, where the wells 306, 308 and the field oxide 310 are formed during front-end processing (e.g., at 54 in FIG. 2). A mask 312 is formed that covers the PMOS region and exposes the NMOS region, and one or more NMOS channel engineering implantation processes 314 are performed (e.g., 56 in FIG. 2), which may include a Vt adjust implant to introduce boron or other p-type dopants into a prospective NMOS channel region, as well as a boron punch-thru implant, and a boron channel stop implant. As may be appreciated, similar processing steps may be employed in the PMOS region. As illustrated in FIG. 4B, a gate dielectric layer 316 is formed above the substrate 304 in the NMOS region (58 in FIG. 2). The gate dielectric layer 316 will be, in one embodiment, about 20 Å thick. In FIG. 4C, mask 312 remains covering the PMOS region and exposing the NMOS region, and a mid-gap metal layer of a TaN (e.g., or other metal nitride material) and a RE-RE metal alloy are co-deposited over the gate dielectric 316 via a CVD, ALD, PVD, or other suitable deposition process 318 (100, 102 in FIG. 3A) in the NMOS region. The thickness of the RE-RE metal alloy-TaN (e.g. mid gap metal) gate electrode layer will be, in one embodiment, from about 5-30 Å.

In this implementation of the invention (e.g., and others described below with respect to FIGS. 3B and 5A-5G), a rare earth series metal (e.g., La, Ce, Pr, Nd, Pm Sm, Eu, Gd, Tb, Dy, Ho, Er, Tm, Yb, or Lu, etc.) is incorporated into the mid-gap metal nitride gate in the NMOS region by co-deposition. In the exemplary device 302, the RE-RE metal alloy is co-deposited 318 with the mid-gap metal to form the incorporated mid-gap metal in the NMOS region. Toward that end, a mask 312 in FIG. 4C (100 in FIG. 3A) covers the PMOS region and exposes the NMOS region. A deposition process 318 is performed (102 in FIG. 3A) to provide the RE-RE metal alloy incorporated mid-gap metal 321 overlying the NMOS region dielectric 316. The deposition process 318 is performed by co-depositing a first rare earth metal, a second rare earth metal, and a mid-gap nitrided metal.

Figure 4D:
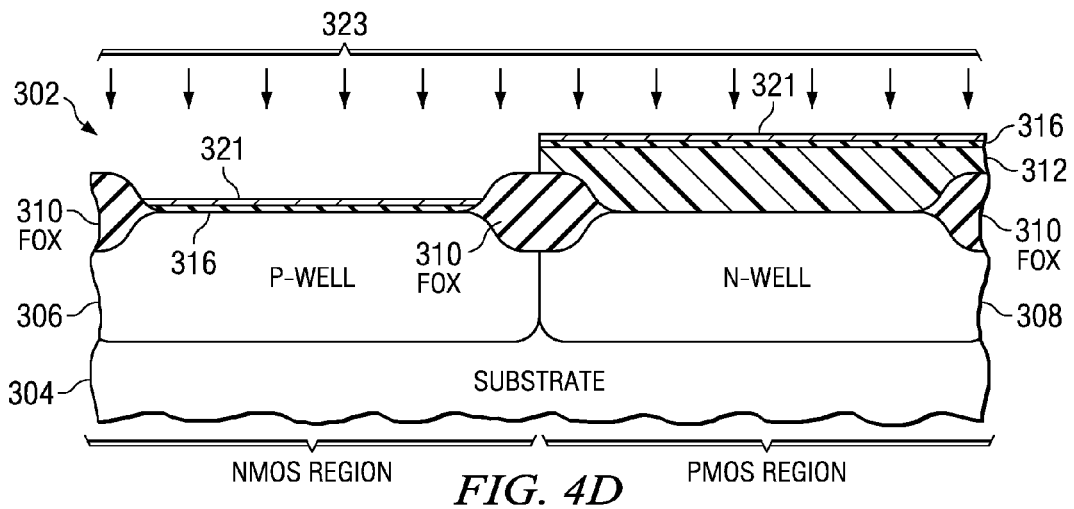

Prior to mask removal, an anneal 323 in FIG. 4D is performed to create a RE-RE metal alloy at 104 within the metal gate electrode 321 in the NMOS region, thereby forming an RE-RE metal alloy incorporated gate electrode, e.g., RE-RE-TaN 321 overlying high-k gate dielectrics 316 in the NMOS region. Annealing is generally performed at a temperature of from about 700° C. to about 900° C. in a nitrogen atmosphere for a period of time sufficient to form the RE-RE metal alloy into the mid-gap metal gate 321. Mask 312 can then be removed (106 in FIG. 3A) and hard mask formed over NMOS region (not shown), followed by patterning and etching to remove dielectric 316 and mid-gap metal 321 in PMOS region.

Figure 4E:
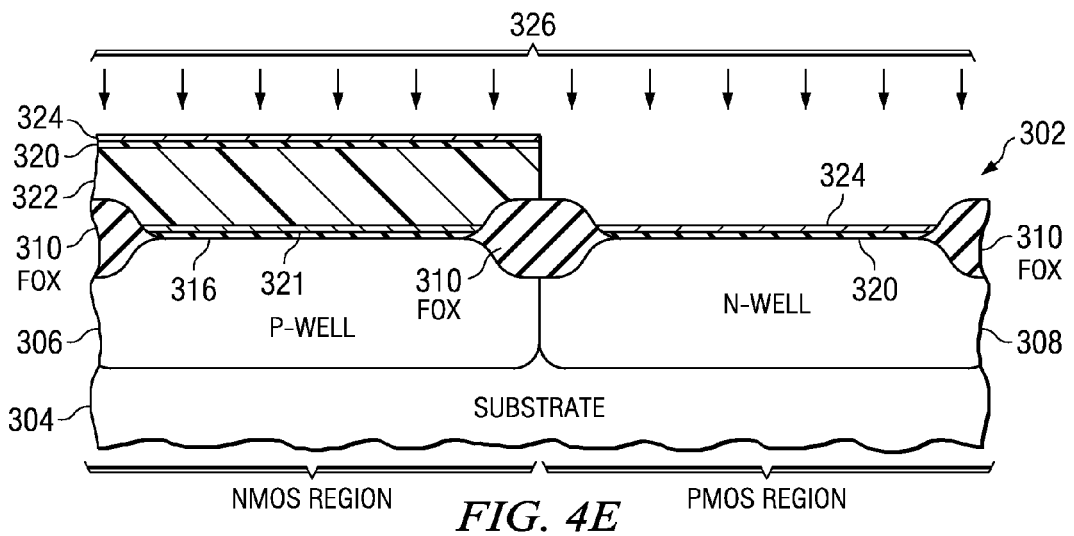
Figure 4F:
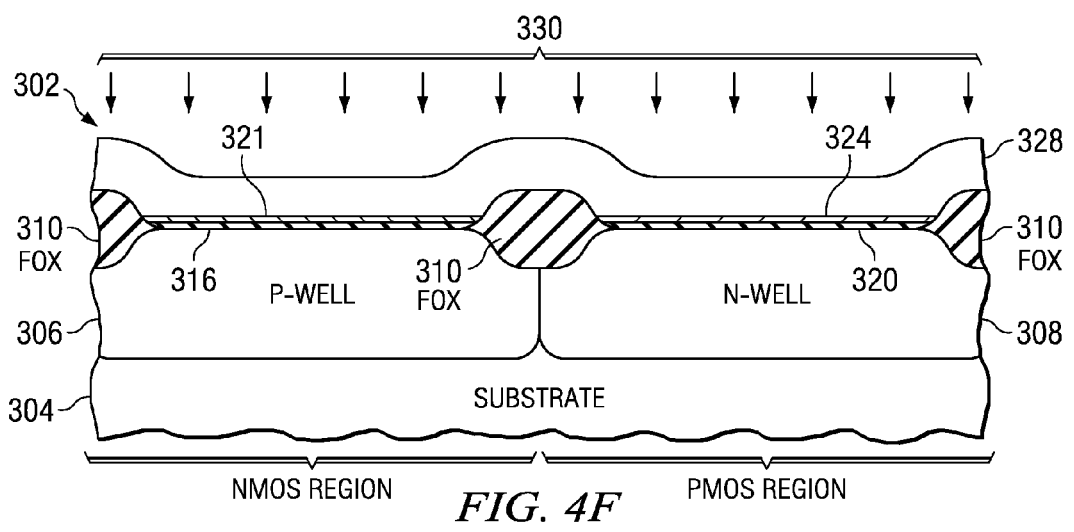
Figure 4G:
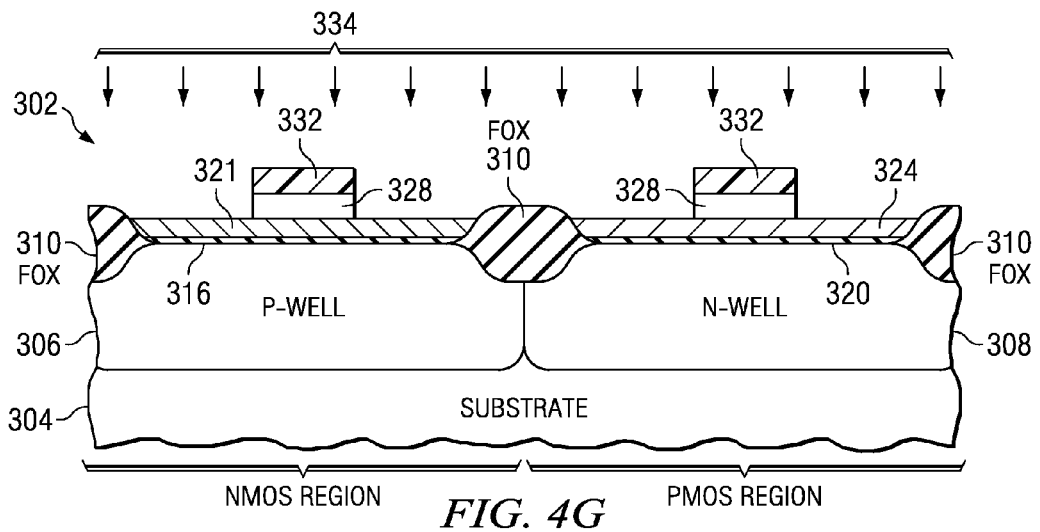
Figure 4H:
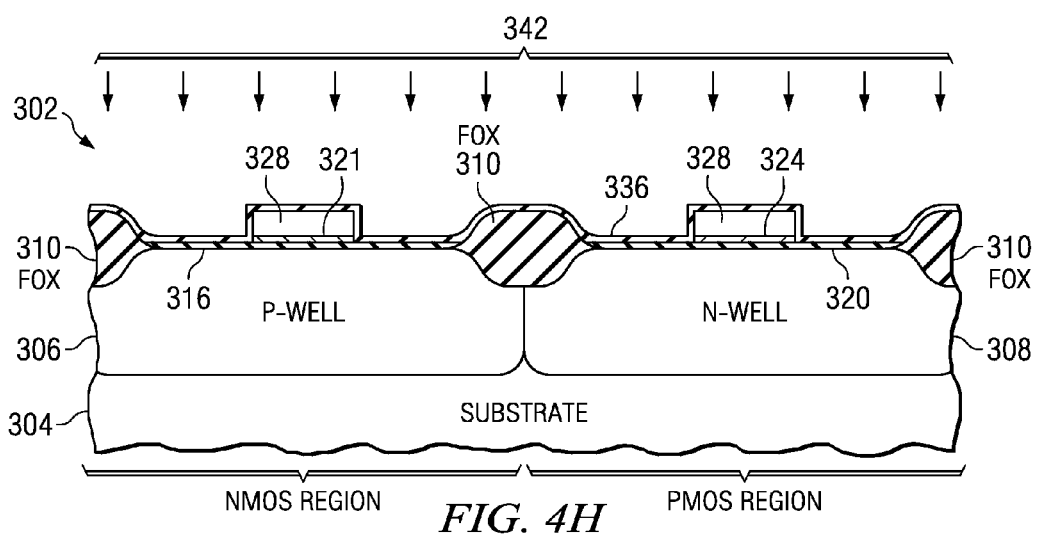

Referring to FIG. 4E, mask 322 is placed over NMOS region and a dielectric 320 and p-metal layer 324 are deposited 326 (110 in FIG. 3A) over the PMOS region via CVD, ALD or PVD, or other suitable deposition process. A mask (not shown) is placed over PMOS region and patterned, followed by an etch process to remove masks in PMOS and NMOS region, as well as dielectric 320 and p-metal 324 in NMOS region. Following mask 322 removal, in FIG. 4F, poly-silicon 328 is deposited (112 in FIG. 3A) over the NMOS and over the PMOS regions, using any suitable deposition process 330. Other implementations of the invention are possible, which alternatively employ tungsten, molybdenum or other refractory metals. In FIG. 4G, the poly-silicon 328, the NMOS and the PMOS are patterned (114 in FIG. 3A) using a mask 332 and an etch process 334 to define patterned NMOS and PMOS gate structures. The mask 332 is then removed and the patterned gate structures are encapsulated (70 In FIG. 2) by forming a single or multi-layer encapsulation structure 336 along the sidewalls and top of the gate structures, as illustrated in FIG. 4H. HDD implants 344 are performed (72 in FIG. 2) to introduce p-type dopants into prospective PMOS source/drains 336 and to introduce n-type dopants into prospective NMOS source/drains 338, wherein the field oxide 310 and patterned gate structures operate as an implantation mask.

Figure 4I:
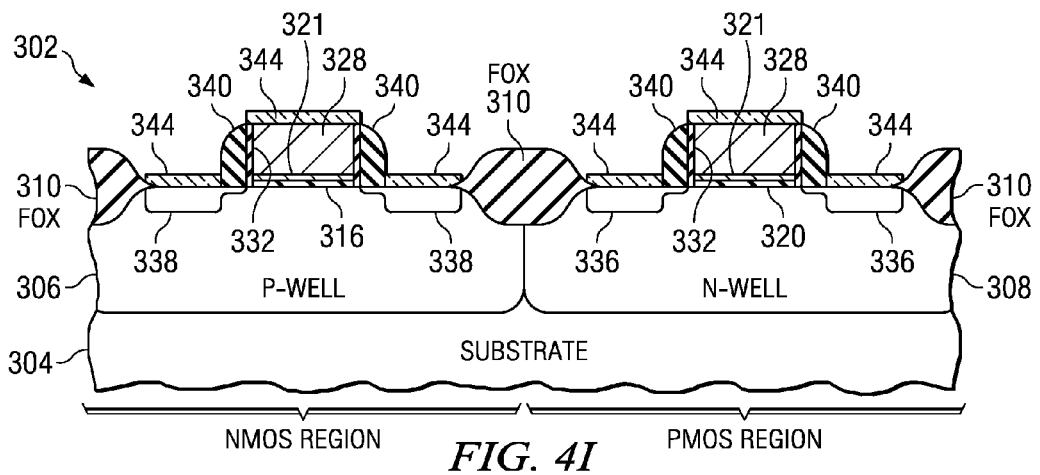

In FIG. 4I, $SiO_2$ or $Si_3N_4$ sidewall spacers 340 are formed along the lateral sidewalls of the patterned gate structures (74 in FIG. 2), and source/drain implants are performed using suitable masks (not shown) to further define the source/drains 336 and 338 and to provide p-type and n-type dopants to the PMOS and NMOS gate poly-silicon 324. Thereafter, self-aligned silicide contacts 344 (salicide) are formed (80 in FIG. 2) over the source/drains 336, 338, and the incorporated gate poly-silicon 328, after which metallization and other back-end processing (82 in FIG. 2) may be performed (not shown in FIG. 4I).

Figure 5A:
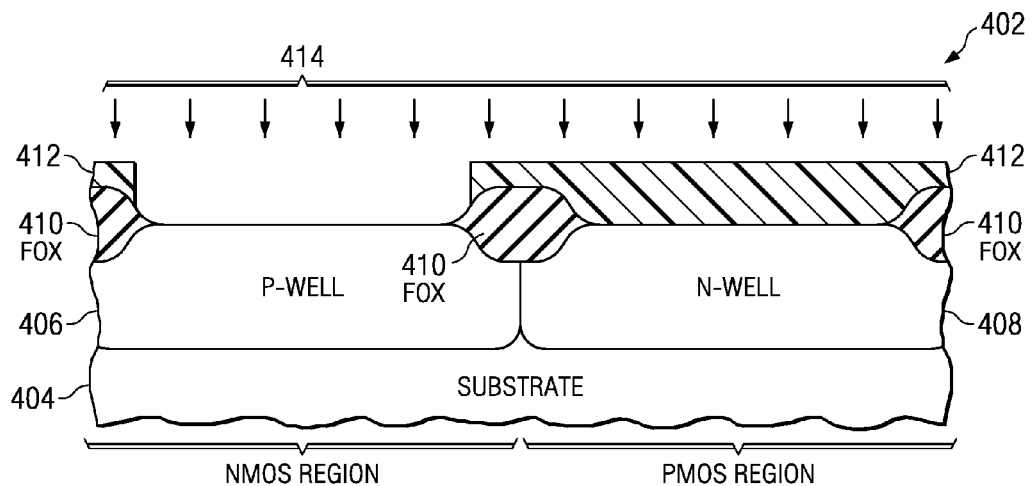
FIGS. 5A-5G are partial side elevation views in section illustrating exemplary NMOS transistors undergoing CMOS metal gate processing in accordance with another implementation of the invention.
Figure 5B:
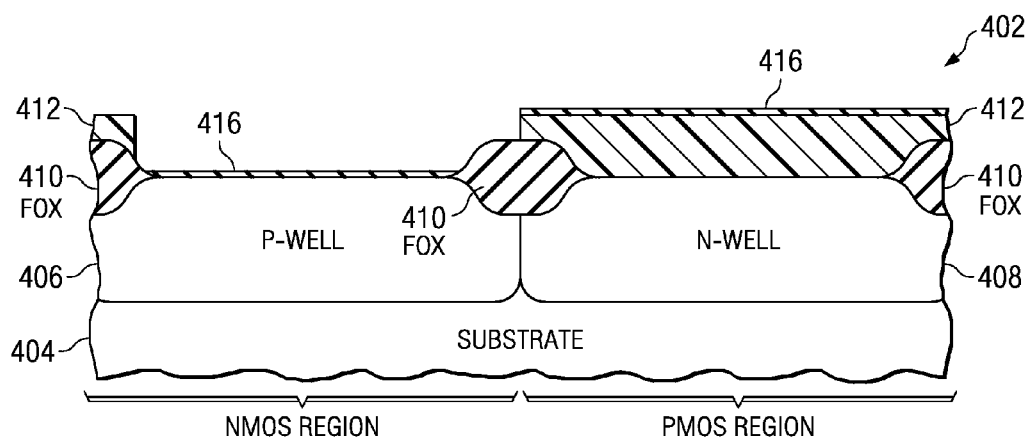

Referring now to FIGS. 2, 3B and 5A, another variant implementation 60b of the gate fabrication processing 60 in the method 50 of FIG. 2 is illustrated. As illustrated in FIG. 5A, the MOS device 402 includes a silicon substrate semiconductor body 404 with a p-well 406 formed in an NMOS region and an n-well 408 formed n a PMOS region. The device 402 further comprises field oxide (FOX) isolation structures 410, where the wells 406, 408 and the field oxide 410 are formed during front-end processing (e.g., at 54 in FIG. 2). A mask 412 is formed that covers the PMOS region and exposes the NMOS region, and one or more NMOS channel engineering implantation processes 414 are performed (e.g., 56 in FIG. 2). Similarly, such engineering may be performed in the PMOS region, in one embodiment. A gate dielectric layer 416 is formed in FIG. 5B above the substrate 404 in the NMOS region (58 in FIG. 2).

Figure 5C:
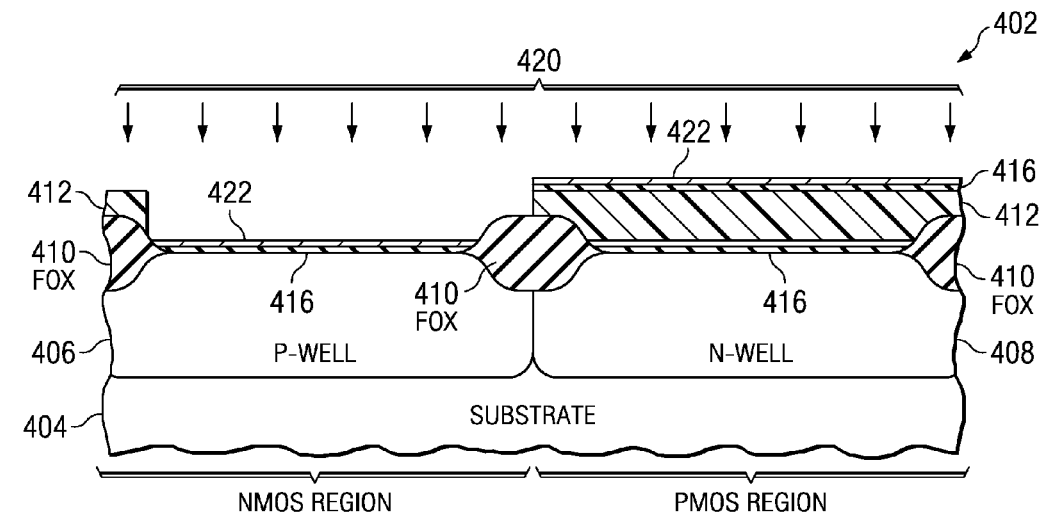
Figure 5D:
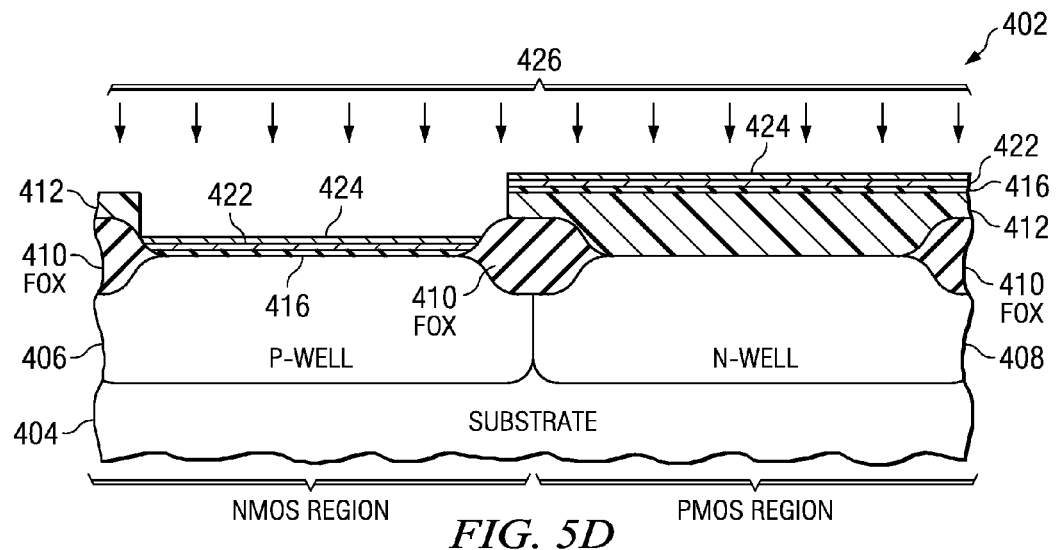

Mask 412 remains (120 in FIG. 3B) covering the PMOS region and exposing the NMOS region, and a layer 422 of a first RE metal and a metal nitride is co-deposited 420 over the gate dielectric 416 in the NMOS region at 122 as shown in FIG. 5C. As illustrated in FIG. 5D, mask 412 remains covering PMOS region and exposing the NMOS region, and a layer of a second RE metal and a metal nitride 424 is co-deposited 426 over first layer 422 (124 in FIG. 3B). An anneal (126 in FIG. 3B) is then performed. Annealing is generally performed at a temperature of from about 700° C. to about 900° C. in a nitrogen atmosphere for a period of time sufficient to form the RE-RE metal alloy in metal gate electrode 422. Mask 412 can then be removed (128 in FIG. 3B) and hard mask formed over NMOS region (not shown), followed by patterning and etching to remove dielectric 416 and RE metal and metal nitride layers 424, 426 in PMOS region.

Figure 5E:
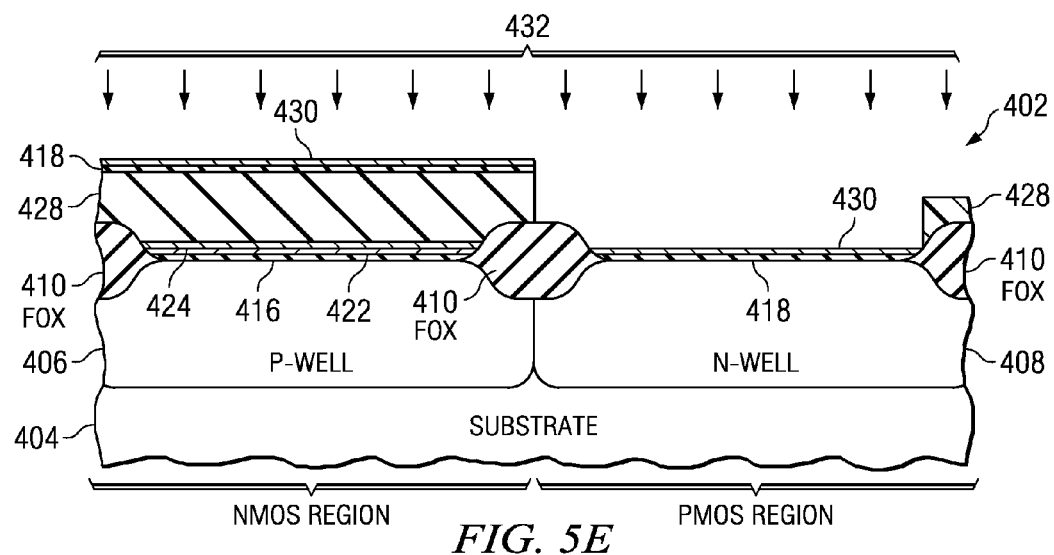
Figure 5F:
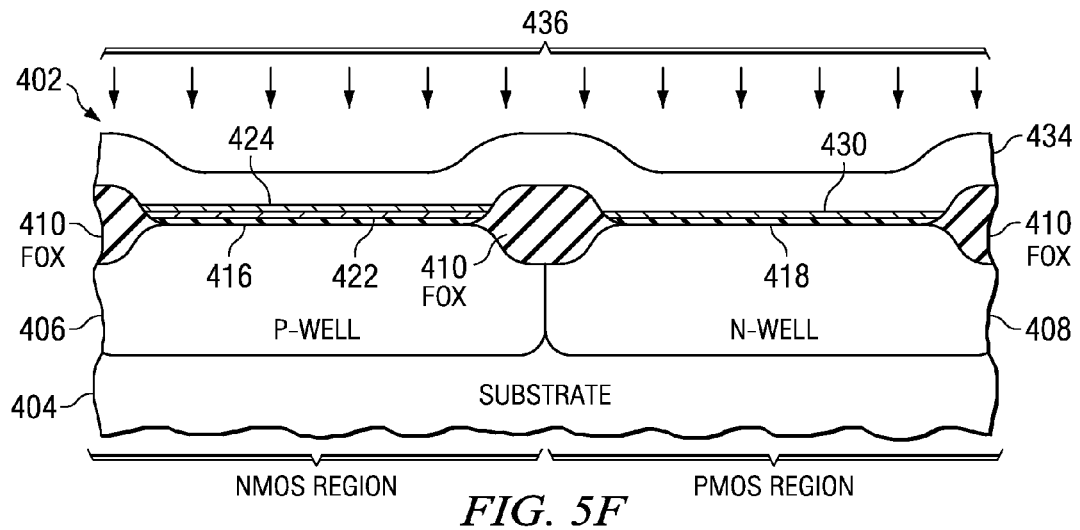

Referring to FIG. 5E, mask 428 is placed over NMOS region (130 in FIG. 3B) and a gate dielectric 418 and p-metal layer 430 are deposited 432 (132 in FIG. 3B) over the PMOS region via CVD, ALD or PVD, or other suitable deposition process. A mask (not shown) is placed over PMOS region and patterned, followed by an etch process to remove masks in PMOS and NMOS region, as well as dielectric 418 and p-metal 430 in NMOS region. Following mask 428 removal, in FIG. 5F, poly-silicon 434 is deposited (134 in FIG. 3B) over the NMOS and over the PMOS regions, using any suitable deposition process 436.

Figure 5G:
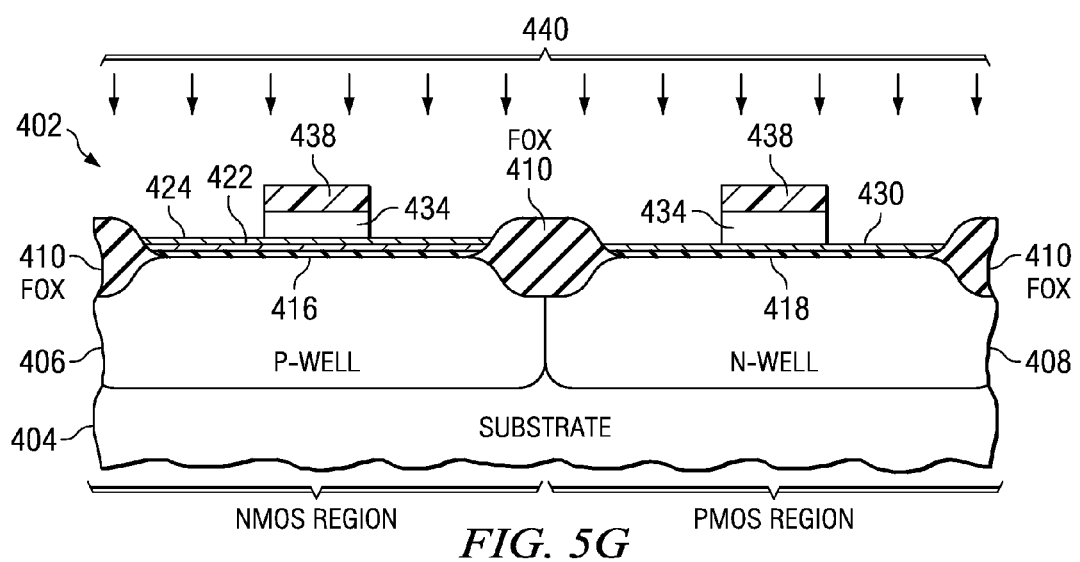

The poly-silicon 534, the NMOS and the PMOS are patterned (136 in FIG. 3B) using a mask 438 and an etch process 440 to define patterned NMOS and PMOS gate structures, as illustrated in FIG. 5G. The structure 402 can then proceed through further processing steps as described with reference to FIGS. 4H and 4I.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating an NMOS metal gate structure in a semiconductor device, the method comprising:
    forming a high-k gate dielectric above a semiconductor body;
    forming a metal gate electrode layer above the gate dielectric by co-depositing an alloy of two rare-earth metals and mid gap metal; and
    patterning the metal gate electrode layer to form an NMOS gate structure.

2. The method of claim 1, wherein the mid gap metal of the metal gate electrode layer comprises a metal nitride of one or more of metal nitrides $M_xN_y$, metal silicon nitrides, $M_xSi_yN_z$, metal aluminum nitrides $M_xAl_yN_z$, and metal aluminum silicon nitrides $M_wAl_xSi_yN_z$, where M is one of Ti, Ta, Hf, Zr, Mo and W.

3. The method of claim 2, wherein the alloy of two rare earth metals is present in the metal nitride layer in an amount from about 10 atomic % (at. %) to about 20 at. %.

4. The method of claim 1, wherein the two rare-earth metals are selected from the groups consisting of lanthanum, cerium, praseodymium, neodymium, promethium, samarium, europium, gadolinium, terbium, dysprosium, holmium, erbium, thulium, ytterbium, lutetium, actinium, thorium, protactinium, uranium, neptunium, plutonium, americium, curium, berkelium, californium, einsteinium, fermium, mendelevium, nobelium, or, lawrencium.

5. The method of claim 4, wherein the ratio of the alloy of two rare earth metals to mid-gap metal is from about 1 at. % to about 9 at. %.

6. The method of claim 1, wherein the alloy of two rare earth metals comprises an alloy of two rare earth metals whose atomic numbers differ by no more than four.

7. The method of claim 1, wherein the thickness of the metal gate electrode layer is from about 5 Å to about 30 Å.

8. The method of claim 1, further comprising annealing the co-deposited alloy of two rare earth metals and mid gap metal.

9. A method of fabricating an NMOS metal gate structures in a semiconductor device, the method comprising:
    forming a high-k gate dielectric on PMOS and NMOS regions above a semiconductor body;
    applying a first mask in the PMOS region;
    forming an alloy of at least two rare earth metals incorporated within a mid gap metal nitride layer above the gate dielectric in the NMOS region;
    removing the mask and applying a second mask over the NMOS region and depositing a metal nitride in the PMOS region;
    removing the mask; and
    patterning the metal nitride layers to form an NMOS gate structure in the NMOS region and a PMOS gate structure in the PMOS region.

10. The method of claim 9, wherein the metal of the metal nitride comprises one or more of metal nitrides $M_xN_y$, metal silicon nitrides, $M_xSi_yN_z$, metal aluminum nitrides $M_xAl_yN_z$, and metal aluminum silicon nitrides $M_wAl_xSi_yN_z$, where M is one of Ti, Ta, Hf, Zr, Mo and W.

11. The method of claim 10, wherein the at least two rare earth metals are selected from the group consisting of lanthanum, cerium, praseodymium, neodymium, promethium, samarium, europium, gadolinium, terbium, dysprosium, holmium, erbium, thulium, ytterbium, lutetium, actinium, thorium, protactinium, uranium, neptunium, plutonium, americium, curium, berkelium, californium, einsteinium, fermium, mendelevium, nobelium, or, lawrencium, and wherein the alloy comprises an alloy of two rare earth metals whose atomic numbers differ by no more than four.

12. The method of claim 9, wherein a thickness of the mid gap metal nitride layer is from about 5 Å to about 10 Å.

13. A semiconductor device comprising:
    an NMOS transistor gate structure comprising a mid-gap metal nitride layer and a high-k gate dielectric between the metal nitride layer and a semiconductor body, the metal nitride layer having an alloy of at least two rare earth metals incorporated therein;
    a PMOS transistor gate structure.

14. The device of claim 13, wherein the rare earth metals are selected from the group consisting of lanthanum, cerium, praseodymium, neodymium, promethium, samarium, europium, gadolinium, terbium, dysprosium, holmium, erbium, thulium, ytterbium, or lutetium.

15. The device of claim 13, wherein the metal nitride structure comprises one or more of $M_xN_y$, $M_xSi_yN_z$, $M_xAl_yN_z$, and $M_wAl_xSi_yN_z$, where M comprises one of Ti, Ta, Hf, Zr, Mo and W.

16. The device of claim 13, wherein the alloy is present in the metal nitride layer in an amount from about 10 at. % to about 20 at. %.

17. The device of claim 13, wherein the ratio of alloy to mid-gap metal is from about 1 at. % to about 9 at. %.

* * * * *